United States Patent [19]

Regan et al.

[11] 4,342,967

[45] Aug. 3, 1982

[54] HIGH VOLTAGE, HIGH FREQUENCY AMPLIFIER

[75] Inventors: Robert J. Regan, Needham; Paul O. Haugsjaa, Acton, both of Mass.

[73] Assignee: GTE Laboratories Incorporated, Waltham, Mass.

[21] Appl. No.: 145,519

[22] Filed: May 1, 1980

[51] Int. Cl.³ .............................................. H03F 3/16
[52] U.S. Cl. .................................. 330/277; 330/293; 330/296; 330/311
[58] Field of Search ................ 330/277, 293, 296, 311

[56] References Cited

U.S. PATENT DOCUMENTS 2,943,267  6/1960  Randise ............................... 330/311
3,401,349  9/1968  Mitchell .............................. 330/277

FOREIGN PATENT DOCUMENTS 1107282  5/1961  Fed. Rep. of Germany ...... 330/311

OTHER PUBLICATIONS

Shaeffer, "VMOS-A Breakthrough in Power MOSFET Technology", Siliconix Application Note An 76-3, May 1976, pp. 1-12.
Nishizawa et al., "Field-Effect Transistor Versus Analog Transistor, (Static Induction Transistor)", *IEEE, Transactions on Electron Devices*, ED-22, No. 4, Apr. 1975, pp. 185-197.

Primary Examiner—James B. Mullins
Attorney, Agent, or Firm—William R. McClellan; J. Stephen Yeo

[57] ABSTRACT

A high frequency amplifier utilizes series-connected transistors to achieve high voltage class C operation. High frequency input power is coupled to the gate of a first FET which is normally biased off. The source of a second FET is coupled to the drain of the first FET. The drain of the second FET, which forms the output of the amplifier, is coupled through a radio frequency choke to a supply voltage. The gate of the second FET is dc biased at about one half of the supply voltage. A capacitor coupled between the gate of the second FET and ground controls the level of high frequency power applied to the second FET. The amplifier can be operated at a dc voltage which is approximately equal to one half the sum of the individual breakdown voltages of the serially connected FET's.

6 Claims, 6 Drawing Figures

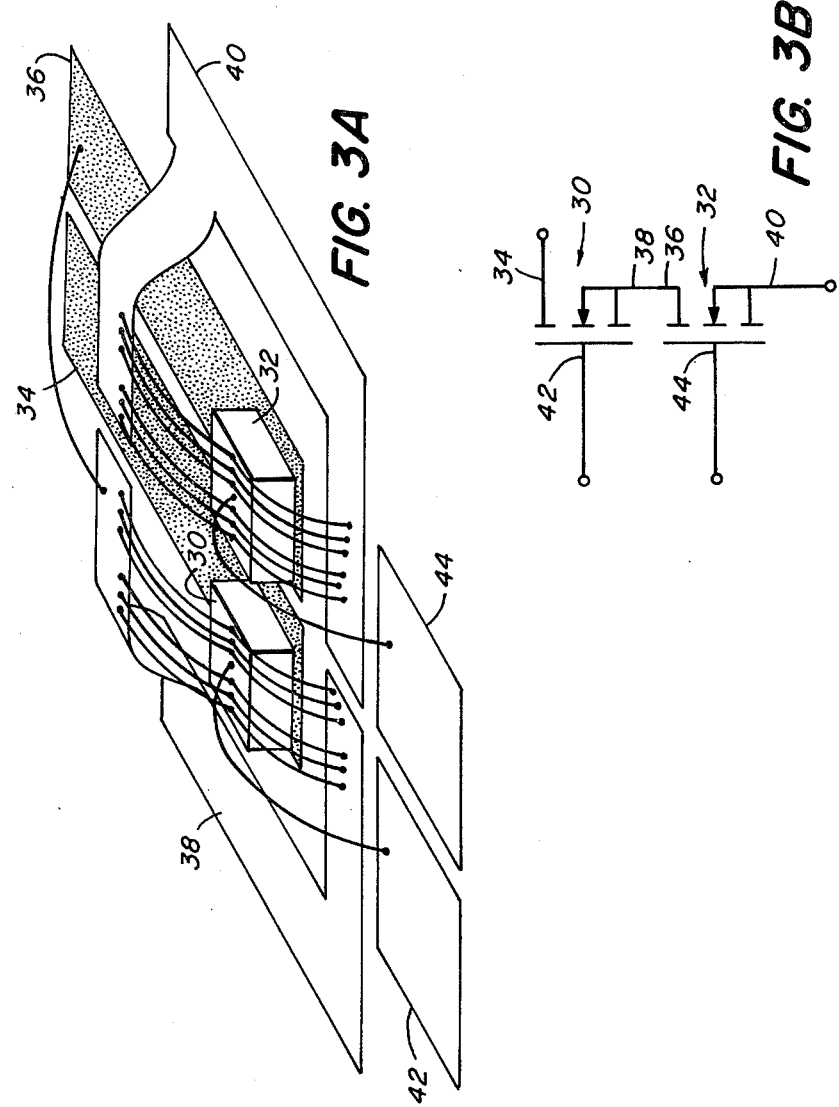

HIGH VOLTAGE, HIGH FREQUENCY AMPLIFIER

BACKGROUND OF THE INVENTION

This invention relates to high voltage, high frequency transistor power amplifiers and, more particularly, to high frequency amplifiers which utilize series connected transistors to permit high operating voltages.

Transistor operating voltages are limited by inter-region breakdown voltages, for example, BVCES (collector-to-emitter breakdown voltage) in the case of a bipolar transistor and $BV_{DSS}$ (drain-to-source breakdown voltage) in the case of a field-effect transistor. When a field-effect transistor is used as the active component in a class C amplifier and the output impedance of the transistor is properly matched, the transistor drain voltage normally swings from the drain-source saturation voltage to approximately twice the supply voltage. Similar voltages occur in class C amplifiers using bipolar transistors. If the load impedance is not matched to the output impedance of the transistor, voltage standing waves with peak amplitudes greater than twice the power supply voltage are possible. Therefore, supply voltages somewhat lower than one-half the maximum breakdown value are normally recommended.

Present day power transistors that are designed to operate at frequencies above 100 megahertz are generally limited to dc power supply voltages below 36 volts.

These supply voltage levels have been established as standards of the industry, probably for reasons ranging from safety to availability of portable power supplies in the form of batteries.

In order to increase output power, parallel active devices or parallel power amplifiers are commonly utilized. The drive power is divided and applied to the individual amplifying devices and the output powers are then combined to achieve the desired power level. This produces a new higher power amplifier which operates at the same dc supply voltage but draws more dc current depending on the number of paralleled power units.

An alternate, and in some cases a more desirable, approach to high frequency, high power amplification is to utilize a higher supply voltage. This approach takes advantage of the relatively high ac voltage available in most homes, offices, and industrial buildings. Conventionally, ac line voltages are stepped down by transformers and rectified to dc voltages compatible with transistor operation. Elimination of power transformers with their associated cost and weight is a major advantage of operating power amplifiers at high voltages. Furthermore, the current requirements are reduced when the supply voltage is increased and the requirement for high current conductors is correspondingly reduced.

Ideally, transistors having high breakdown voltage capabilities would be utilized with high supply voltages. However, high breakdown voltage and high frequency operation are conflicting requirements in semiconductor device design. Because of the thin interaction regions necessary to achieve high operating frequencies, these devices have inherently low breakdown voltages.

SUMMARY OF THE INVENTION

Accordingly, it is an object of the present invention to provide new and improved high frequency amplifiers capable of high voltage operation.

According to the present invention, these and other objects and advantages are achieved in a high frequency amplifier wherein a plurality of transistors coupled in series includes a first transistor and a second transistor. Each of the plurality of transistors includes a first, a second, and a third electrode and has an associated second to third electrode breakdown voltage. The first transistor has the third electrode thereof coupled to a reference potential and the second electrode thereof coupled to the third electrode of one of the plurality of transistors. The second transistor has the third electrode thereof coupled to the second electrode of another of the plurality of transistors. An input terminal for receiving high frequency power is coupled to the first electrode of the first transistor. First dc biasing means, coupled to the first electrode of the first transistor, applies thereto a dc bias potential substantially equal to the reference potential. An output terminal for delivering high frequency power to a load is coupled to the second electrode of the second transistor. An inductor means is coupled between the second electrode of the second transistor and a source of operating potential. Each of the plurality of transistors except the first transistor has coupled to the first electrode thereof a means for biasing the first electrode at a dc bias potential between the operating potential and the reference potential. Each of the plurality of transistors except the first transistor also has coupled to the first electrode thereof a means for applying thereto a predetermined level of high frequency power. The operating potential of the amplifier can be substantially equal to one half the sum of the breakdown voltages of the plurality of transistors.

BRIEF DESCRIPTION OF THE DRAWINGS

In the drawings:

FIG. 3A is an illustration of a dual chip, single package, high frequency FET which can be used in the amplifier of FIG. 1; and FIG. 3B is a schematic circuit diagram of the dual transistor shown in FIG. 3A.

For a better understanding of the present invention, together with other and further objects, advantages, and capabilities thereof, reference is made to the following disclosure and appended claims in connection with the above-described drawings.

DETAILED DESCRIPTION OF THE INVENTION

Figure 1:
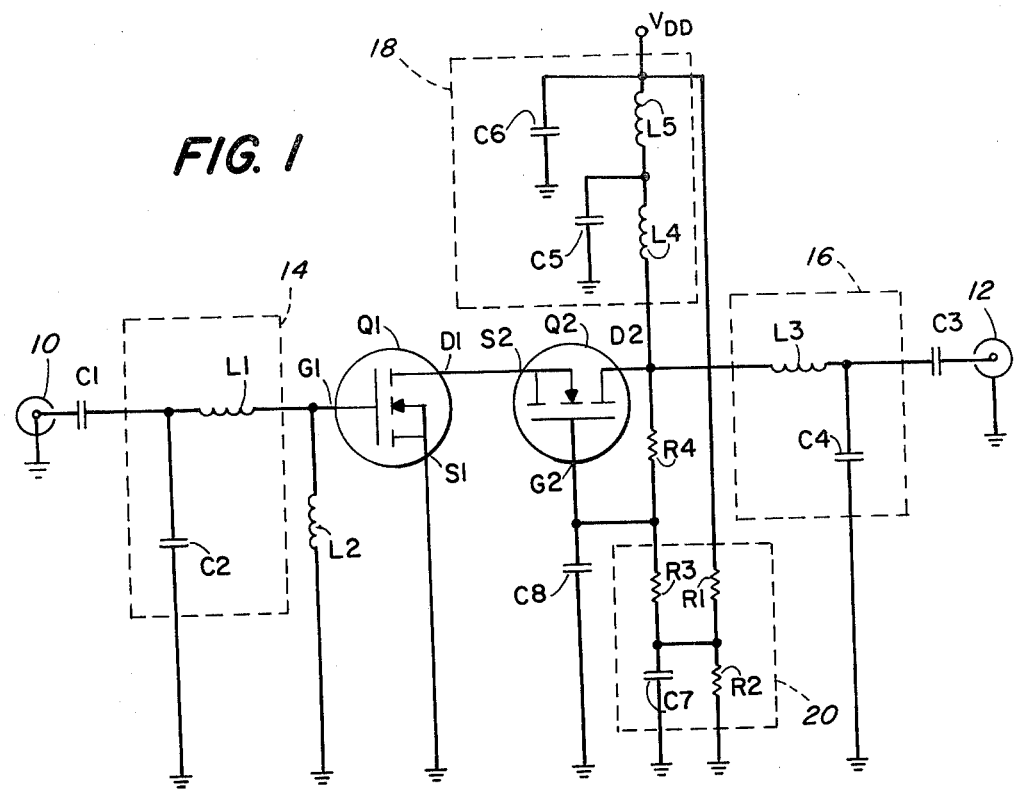
FIG. 1 is a schematic circuit diagram of a high frequency amplifier according to the present invention.

A preferred embodiment of a high frequency amplifier according to the present invention utilizing N-channel enhancement mode VHF power metal-oxide-silicon field effect transistors (MOSFETs) is illustrated in FIG. 1. An input terminal 10 receives high frequency power from an external source. The amplified high frequency power is delivered to a load at an output terminal 12. The amplifier is operated from a dc supply voltage $V_{DD}$.

The input terminal 10 is coupled through a dc blocking capacitor C1 and inductor L1 to a gate electrode G1 of a first transistor Q1. The common connection point of the capacitor C1 and the inductor L1 is coupled to a reference potential, which in the present example is ground, through a capacitor C2. The The combination of the inductor L1 and the capacitor C2 form an input impedance matching network 14 which operates to match the impedance of the high frequency source to the input impedance of the transistor Q1. The gate electrode G1 of the transistor Q1 is coupled through a radio frequency choke or inductor L2 to ground. A source electrode S1 of the transistor Q1 is coupled to ground. The inductor L2 operates to bias the transistor Q1 in an off state with no signal present and presents a high impedance to high frequency power.

A drain electrode D1 of the transistor Q1 is coupled to a source electrode S2 of a second transistor Q2. A drain electrode D2 of the transistor Q2 is coupled through the series combination of an inductor L3 and a dc blocking capacitor C3 to the output terminal 12. The common connection point of the inductor L3 and the capacitor C3 is coupled to ground through a capacitor C4. The combination of the inductor L3 and the capacitor C4 form an output impedance matching network 16 which operates to match the output impedance of the transistor Q2 to the impedance of the load connected to the output terminal 12. The drain electrode D2 of the transistor Q2 is further coupled through a series combination of inductors L4 and L5 to a source of operating potential such as dc supply voltage $V_{DD}$. The common connection point of the inductors L4 and L5 is coupled to ground through a capacitor C5. The dc supply voltage $V_{DD}$ is coupled to ground through a capacitor C6. The combination of the inductors L4 and L5 and the capacitors C5 and C6 form a filter network 18 which conducts current from the dc voltage source to the drain electrode D2 of the transistor Q2 while blocking conduction of high frequency current from the drain electrode D2 of the transistor Q2 to the dc voltage source.

A resistor R1 and a resistor R2 are coupled in series between the dc supply voltage $V_{DD}$ and ground. The junction point of the resistors R1 and R2 is coupled through a resistor R3 to a gate electrode G2 of the transistor Q2. The junction point of the resistors R1 and R2 is coupled to ground through a decoupling capacitor C7 which filters high frequency power appearing at that point. The combination of the resistors R1, R2, and R3 and the capacitor C7 form a dc biasing network 20 which is operative to provide a dc bias voltage to the gate electrode G2 of the transistor Q2. A capacitor C8 is coupled between the gate electrode G2 of the transistor Q2 and ground. A feedback resistor R4 is coupled between the gate electrode G2 and the drain electrode D2 of the transistor Q2.

The transistors Q1 and Q2 in the amplifier shown in FIG. 1 are biased to operate in the class C mode. The inductor L2 provides a dc bias of zero volts between the gate electrode G1 and the source electrode S1 of the transistor Q1. The dc biasing network 20 is operative to provide a bias voltage at the gate electrode G2 of the transistor Q2 which is approximately one-half the dc supply voltage $V_{DD}$. Properly tuned, the amplifier operates with the dc supply voltage $V_{DD}$ shared approximately equally between the transistors Q1 and Q2, thus establishing a peak to peak high frequency voltage signal at the drain electrode D1 of the transistor Q1 which is about equal to the dc supply voltage $V_{DD}$. When broadband amplifier operation is desired, the input impedance matching network 14 and the output impedance matching network 16 can be replaced by appropriate broadband networks as is known to those skilled in the art.

Figure 2A:
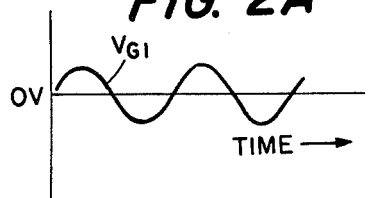
FIGS. 2A, 2B, and 2C are graphic representations of voltage wave forms occurring at various points in the circuit shown in FIG. 1.
Figure 2B:
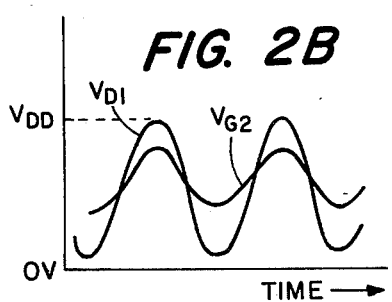
Figure 2C:
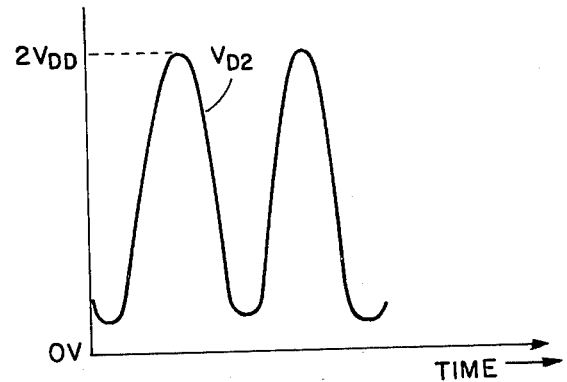

Referring now to FIGS. 2A, 2B, and 2C, there are shown wave forms occurring at various points in the amplifier of FIG. 1 when high frequency power is applied thereto. FIG. 2A represents, for reference purposes, an input high frequency voltage signal appearing at the gate electrode G1 of the transistor Q1. FIG. 2B shows the relationship between the signal on the drain electrode D1 of the transistor Q1, $V_{D1}$, and the signal on the gate electrode G2 of the transistor Q2, $V_{G2}$. The difference between $V_{D1}$ and $V_{G2}$ is the gate-source drive signal for the transistor Q2. The waveform of the high frequency output signal at the drain electrode D2 of the transistor Q2, $V_{D2}$, is shown in FIG. 2C. The maximum value is approximately twice the dc supply voltage $V_{DD}$ and the minimum value is indicative of the sum of the drain-to-source on-resistances of the transistors Q1 and Q2. The transistor Q2 has an associated parasitic capacitance $C_{DG}$ (not shown) between the drain electrode D2 and the gate electrode G2. The parasitic capacitance $C_{DG}$, the resistor R4, and the capacitor C8 combine to control the level of the high frequency power applied to the gate electrode G2 of the transistor Q2 by feeding a portion of the high frequency signal on the drain electrode D2 back to the gate electrode G2.

A specific embodiment of the amplifier illustrated in FIG. 1 was constructed employing the following components.

| | |
|---|---|
| Q1, Q2 | Siliconix VMP4 N-channel MOSFET |
| R1 | 220 kilohoms |
| R2 | 110 kilohms |
| R3 | 330 kilohms |
| R4 | 1 megohm |
| C1, C3, C7 | 220 picofarads |
| C2, C8 | 4–60 picofarads variable |
| C4 | 3–35 picofarads variable |
| C5 | 1 microfarad |
| C6 | .0015 microfarad |
| L1 | 2 turns, 18 gauge wire, ⅜ inch OD, air core |
| L2, L4, L5 | .12 microhenry |
| L3 | 5 turns, 18 gauge wire, ⅜ inch OD, air core |

An amplifier utilizing the above components was operated at 215 megahertz and a dc supply voltage $V_{DD}$ of about 70 volts. The amplifier produced an output power of about 23 watts for an input drive power of 1.5 watts. Although the drain-to-source breakdown voltage of the VMP4 is specified by the manufacturer at 60 volts, the peak voltage at the drain electrode D2 of the transistor Q2 was about 140 volts with respect to ground.

Due in part to the presently unavailable values of the common gate operated VMP4 source-to-gate and drain-to-gate impedances, capacitor and inductor values were arrived at using an empirical approach. A Hewlett-Packard 8410B network analyzer was set up in the drive circuit so that the impedance could be monitored and adjustments were made to the inductor L1 and the capacitor C1 shown in FIG. 1 as required to accomplish a match to a 50 ohm source impedance. The inductor L3 and the capacitor C4 correspondingly were initially set to accommodate an impedance match to the series connection of the common source VMP4 output impedances. Then by monitoring the output power and the amplifier power-added efficiency, as determined by means of an HP434A power calorimeter, the inductor L3 and the capacitor C4 were adjusted for optimum performance. Adjustments were also made to the capacitor C8 and to the dc level on the gate electrode G2 of the transistor Q2 while monitoring the drain-to-ground voltage signals of both transistors Q1 and Q2 with a Tektronix P6201 FET probe in connection with a Tektronix 7904 high frequency oscilloscope.

While the amplifier shown in FIG. 1 utilizes MOSFET transistors Q1 and Q2, recently developed static induction transistors are particularly useful in the amplifier of the present invention. Static induction transistors are disclosed by Nishizawa et al. in "Field Effect Transistors Versus Analog Transistor (Static Induction Transistor)", *IEEE Transactions on Electron Devices*, ED-22, No. 4 (April 1975). Furthermore, high frequency bipolar transistors can be used in the amplifier disclosed herein by suitable dc biasing changes which will be obvious to those skilled in the art. While the amplifier shown in FIG. 1 utilizes two serially connected transistors to increase operating voltage, further increases in operating voltage can be achieved by utilizing one or more additional transistors connected in series between the transistors Q1 and Q2. Each additional transistor has an associated dc biasing network connected to a gate electrode. The dc biasing networks divide the dc supply voltage equally between the serially connected transistors. Each additional transistor also has a capacitor coupled between the gate electrode and ground for establishing the level of high frequency power applied to the gate electrode.

When it is important to minimize the physical size of the amplifier of the present invention, the transistors Q1 and Q2 can be mounted and sealed within a single transistor package. Such a device was constructed by modifying a Siliconix prototype device which contains two MOSFET transistor chips initially connected in parallel. FIG. 3A illustrates the interior of the dual transistor package after completion of the modification for series operation. Two MOSFET transistor chips 30 and 32 are connected electrically in series and thermally in parallel. The transistor chips 30 and 32 are vertically structured with a drain on the bottom and an array of interdigitated source and gate metallized fingers on the top surface.

Drain contacts the bottom of the transistor chips 30 and 32 are bonded to drain metallizations 34 and 36, respectively. Source contacts of the transistor chips 30 and 32 are connected to source metallizations 38 and 40, respectively. Multiple bond wires are used to increase current carrying capability. Initially in the parallel configuration, the source contacts of the transistor chips 30 and 32 are connected to one common source metallization. As a part of the modification, the common source metallization is cut apart between the transistor chips 30 and 32 to produce the source metallizations 38 and 40. Gate contacts of the transistor chips 30 and 32 are connected to gate metallizations 42 and 44, respectively. The source metallization 38 of the transistor chip 30 is connected to the drain metallization 36 of the transistor chip 32 by a 0.0045 inch diameter tinned copper wire. All other bond wires are 0.001 inch diameter aluminum. The package is a standard microstrip type 380J0. An electrical schematic of the dual transistor configuration of FIG. 3A is shown in FIG. 3B.

Since the amplifier according to the present invention utilizes serially connected transistors, it can be operated at a dc supply voltage which is approximately equal to one half the sum of the individual breakdown voltages of the serially connected transistors. High frequency power sources which can be operated at high supply voltage levels become increasingly attractive in terms of size, weight, and cost as new products which require high frequency power enter the consumer marketplace. Elimination of the power transformer is the major feature of such high frequency high voltage power sources.

While there has been shown and described what is considered a preferred embodiment of the present invention, it will be obvious to those skilled in the art that various changes and modifications may be made therein without departing from the invention as defined by the appended claims.

What is claimed is:

1. A high frequency amplifier comprising:
   an input terminal for receiving high frequency power;
   a first transistor having a first electrode coupled to said input terminal, a second electrode, and a third electrode coupled to a reference potential;
   first dc biasing means, coupled to said first electrode of said first transistor, for applying thereto a dc bias potential substantially equal to said reference potential;
   a second transistor having first and second electrodes and a third electrode coupled to said second electrode of said first transistor, said first and second transistors each having an associated second to third electrode breakdown voltage, an associated second to first electrode interelectrode capacitance, and an associated third to first electrode interelectrode capacitance;
   an output terminal, coupled to said second electrode of said second transistor, for delivering high frequency power to a load;
   inductor means coupled between said second electrode of said second transistor and a source of operating potential;
   impedance means coupled between said second and first electrode of said second transistor;
   capacitive means coupled between said first electrode of said second transistor and said reference potential, and cooperating with said impedance means and said second to first electrode interelectrode capacitance of said second transistor to provide feedback between said second and first electrodes of said second transistor; and
   second dc biasing means, coupled to said first electrode of said second transistor, and said capacitive means for applying thereto a dc bias potential of substantially one half of said operating potential and said reference potential;
   whereby the operating potential of said amplifier can be substantially equal to one half the sum of said breakdown voltages of said first and second transistors.

2. A high frequency amplifier as defined in claim 1 wherein said reference potential is ground potential and wherein said bias potential is about one half of said operating potential.

3. A high frequency amplifier as defined in claim 1 wherein said second dc biasing means includes resistive divider means for dividing the operating potential.

4. A high frequency amplifier as defined in claim 1 wherein said first dc biasing means includes inductor means coupled between said first and third electrodes of said first transistor.

5. A high frequency amplifier as defined in claims 1, 2, 3 or 24 wherein said first and second transistors are field effect transistors, said first electrodes are gate electrodes, said second electrodes are drain electrodes, and said third electrodes are source electrodes.

6. A high frequency amplifier as defined in claims 1, 2, 3 or 4 wherein said first and second transistors are static induction transistors, said second electrodes are drain electrodes, and said third electrodes are source electrodes.

* * * * *